United States Patent
Bibl et al.

(10) Patent No.: US 8,980,115 B2
(45) Date of Patent: Mar. 17, 2015

(54) COVER GLASS FOR ELECTRONIC DEVICES

(75) Inventors: David N. Bibl, Santa Cruz, CA (US); Leo B. Baldwin, San Jose, CA (US)

(73) Assignee: Amazon Technologies, Inc., Reno, NV (US)

( * ) Notice: Subject to any disclaimer, the term of this patent is extended or adjusted under 35 U.S.C. 154(b) by 157 days.

(21) Appl. No.: 13/414,549

(22) Filed: Mar. 7, 2012

(65) Prior Publication Data
US 2013/0071601 A1    Mar. 21, 2013

Related U.S. Application Data

(60) Provisional application No. 61/535,724, filed on Sep. 16, 2011.

(51) Int. Cl.
| C03C 15/00 | (2006.01) |
| B32B 3/02 | (2006.01) |
| C03B 23/203 | (2006.01) |
| C03C 23/00 | (2006.01) |
| B32B 17/06 | (2006.01) |

(52) U.S. Cl.
CPC . *B32B 3/02* (2013.01); *C03C 15/00* (2013.01); *C03B 23/203* (2013.01); *C03C 23/0025* (2013.01); *C03C 23/007* (2013.01); *B32B 17/06* (2013.01)
USPC .......... 216/97; 216/23; 216/24; 216/83; 65/31; 65/36; 65/56; 65/152; 264/400; 438/127

(58) Field of Classification Search
CPC ... H01L 24/00; H01L 2924/181; H01L 23/02; H01L 2924/1652; B23K 26/36738; B23K 26/407; C03C 23/0025; C03C 19/00; C03C 23/007; C03C 23/0075; B32B 17/06; B32B 2457/20; B32B 3/02; C03B 23/203; C03B 33/082; C03B 33/093
See application file for complete search history.

(56) References Cited

U.S. PATENT DOCUMENTS

| 7,789,725 | B1 * | 9/2010 | George et al. ................... 445/25 |
| 2001/0049031 | A1 * | 12/2001 | Bajorek et al. .......... 428/694 ST |
| 2002/0041946 | A1 * | 4/2002 | Abe ............................. 428/64.2 |
| 2002/0157199 | A1 * | 10/2002 | Piltingsrud ....................... 15/77 |
| 2007/0062921 | A1 * | 3/2007 | Karube et al. ............ 219/121.72 |
| 2008/0053972 | A1 * | 3/2008 | Otsu et al. ................ 219/121.62 |
| 2009/0090694 | A1 | 4/2009 | Hotelling et al. |
| 2011/0012873 | A1 * | 1/2011 | Prest et al. .................... 345/204 |

FOREIGN PATENT DOCUMENTS

WO    2008150355 A1    12/2008

OTHER PUBLICATIONS

F. Chen et al. "Maskless Fabrication of Concave Microlens Arrays on Silica Glasses by a Femtosecond-Laser-Enhanced Local Wet Etching Method", Optical Express, vol. 18, 2010, pp. 20334-20343.*

* cited by examiner

*Primary Examiner* — Lan Vinh
*Assistant Examiner* — Jiong-Ping Lu
(74) *Attorney, Agent, or Firm* — Novak Druce Connolly Bove + Quigg LLP

(57) ABSTRACT

A cover glass element can extend to the edges of an electronic device while maintaining the optical flatness and thickness needed for the cover glass. A first glass sheet with the desired thickness and flatness can be thermally bonded to a second glass sheet machined to include an opening to be received by the edges of the electronic device. The resulting three-dimensional cover element forms a uni-body frame that is significantly stiffer than a single sheet of glass, and the larger surface area of the edge provides for enhances pressure distribution, particularly after chemical strengthening, thus enhancing the durability of the electronic device. Further, the thermal bonding process uses lower temperatures than processes such as slumping or pressing, which could potentially affect the flatness and optical clarity of the original sheet glass.

20 Claims, 7 Drawing Sheets

COVER GLASS FOR ELECTRONIC DEVICES

CROSS-REFERENCE TO RELATED APPLICATION

The present application claims the benefit of U.S. Provisional Application No. 61/535,724, filed Sep. 16, 2011, and entitled "Cover Glass for Electronic Devices," the full disclosure or which is incorporated herein by reference.

BACKGROUND

People are increasingly utilizing portable computing devices, such as smart phones and tablet computers, for a variety of tasks. In many instances, these devices include at least one display screen including a display element, such as a liquid crystal display (LCD) element, at least one touch sensitive component, and an overlying transparent layer. This overlying layer typically comprises a sheet of cover glass, which generally has a uniform thickness to ensure proper connection with various components of the display screen, as well as to prevent unintended optical artifacts. As the size of the display screens increase, and as the thickness of the devices decrease, the transparent cover layers are increasingly subject to damage due to actions such as dropping a device or applying an unexpected point pressure. The edges of the cover layer can be particularly susceptible to damage, which is increasing problematic as the edges of the screen approach the edges of the various computing devices.

BRIEF DESCRIPTION OF THE DRAWINGS

Various embodiments in accordance with the present disclosure will be described with reference to the drawings, in which.

DETAILED DESCRIPTION

Systems and methods in accordance with various embodiments of the present disclosure may overcome one or more of the aforementioned and other deficiencies experienced in conventional cover layers utilized with various electronic devices. In particular, various embodiments utilize a glass fusion process to bond at least two glass layers in order to form a cover glass element that provides a smooth, consistent cover glass surface with a robust edge. The cover glass element can have a thin glass cross-section corresponding to a central area of an electronic device to receive the cover glass element and to accommodate device components while providing the ability to have variable cross-section dimensions at other areas. An example cover glass element provides enhanced strength at the edges with respect to conventional cover glass layers, but maintains the uniformity needed for the primary optical display portion of the cover glass element. Such an approach can be used to manufacture multiple cover glass elements concurrently, in order to provide an economical approach to the formation of such elements.

Due at least in part to the increased strength of the cover glass elements with respect to conventional cover layers, a glass element can be designed to extend to and/or over one or more edges of an electronic device. The ability to wrap the cover glass around the edge(s) can provide for a smooth, polished edge that is also durable to dropping or other impact actions. Further, such a design can be aesthetically pleasing, and can enable other functionality, such as display or touch inputs, to be extended to the sides or edges of a device as well. An additional benefit of such a design is that the radio frequency (RF) transparent regions of the device as enlarged, providing for improved performance and increased flexibility in antennae placement.

Various other applications, processes, implementations, and uses are presented below with respect to the various embodiments.

Figure 1:
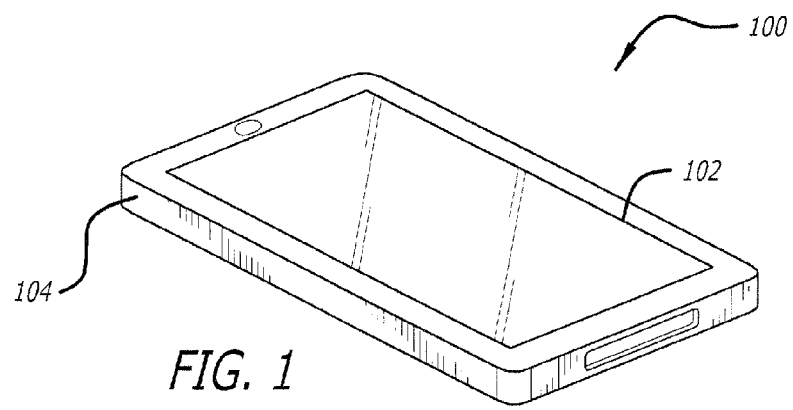
FIG. 1 illustrates an example computing device including a conventional cover glass.

FIG. 1 illustrates an example portable computing device 100 including a conventional cover layer 102 that extends across a large portion of a face of the device, but is separated a distance from the edges 104 of the device. Although a portable computing device (e.g., a smart phone, an e-book reader, or tablet computer) is shown, it should be understood that various other types of electronic device might be able to take advantage of a cover glass element in accordance with various embodiments discussed herein. These devices can include, for example, notebook computers, personal data assistants, cellular phones, video gaming consoles or controllers, and portable media players, among others. As discussed, the edges of the cover layer 102 can be relatively susceptible to damage. In many cases, the cover glass is less than 1.0 mm thick. Even though the glass is chemically strengthened in many cases, the edges are still relatively fragile, and generally more susceptible to damage from point loads, as compared to central areas of the cover glass. The cover layer thus is separated a distance from the edges 104 in order to minimize the likelihood of damage to the cover layer and the underlying display. Such deficiencies limit the amount of the face of the device that can be used for the display element, which can be undesirable for potential users as well as developers and other such persons.

Figure 2:
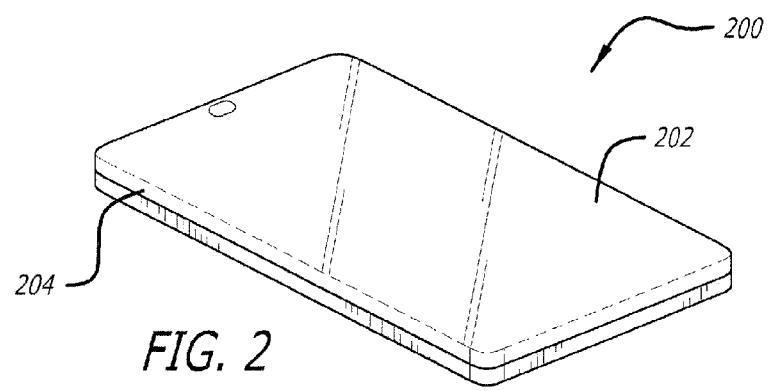
FIG. 2 illustrates an example computing device including an edge-to-edge cover glass in accordance with various embodiments.

FIG. 2 illustrates another example computing device 200 where the device has a cover glass element 202 that extends to the edges 204 of the device, and in fact wraps around the edges corners of the device. The ability to include edge regions with the cover glass can increase the surface area of the glass edges, which can increase the durability from a process such as chemical strengthening. Further, the edge portions can be thicker than the primary display portion, which can provide further rigidity. Further still, the edge-toedge cover glass can enable an entire face of the device 200 to potentially be display capable and/or touch sensitive, among other potential aspects.

It is not straightforward, however, to form such a shaped glass element for these types of devices. Certain approaches to forming three-dimensional glass elements utilize processes such as glass slumping, wherein a sheet of glass is heated beyond the transition temperature while placed on a one-sided mold (or in a two-sided mold). Gravity (or other applied force) causes the glass to slowly flow into the mold. These processes are not ideal for computing device displays, however, as they typically have problems with uniformity and optical flatness. Further, for devices with touch-sensitive displays there typically must be a proper connection between the touch sensors and the cover layer in order to ensure proper touch sensitivity. Since the cover glass is part of the display screen it also can be desirable to ensure as few optical defects or artifacts as possible. Certain approaches attempt to flatten or smooth the glass using a grinding or polishing process, but such an approach is of limited use for three-dimensional shapes with corners and other difficult-to-polish features.

Accordingly, systems and methods in accordance with various embodiments utilize a process such as thermal bonding to enable multiple glass sheets to be formed into a single glass element. The ability to utilize multiple sheets or layers of material enables portions of the resulting element to be of a controlled thickness and flatness at various portions, by utilizing a first sheet having those characteristics, and portions to be of a controlled and polished shape, by utilizing a second sheet that is able to be machined to a desired level of quality without worrying about affecting the quality of the first sheet or polishing complex three-dimensional features.

Figure 3:
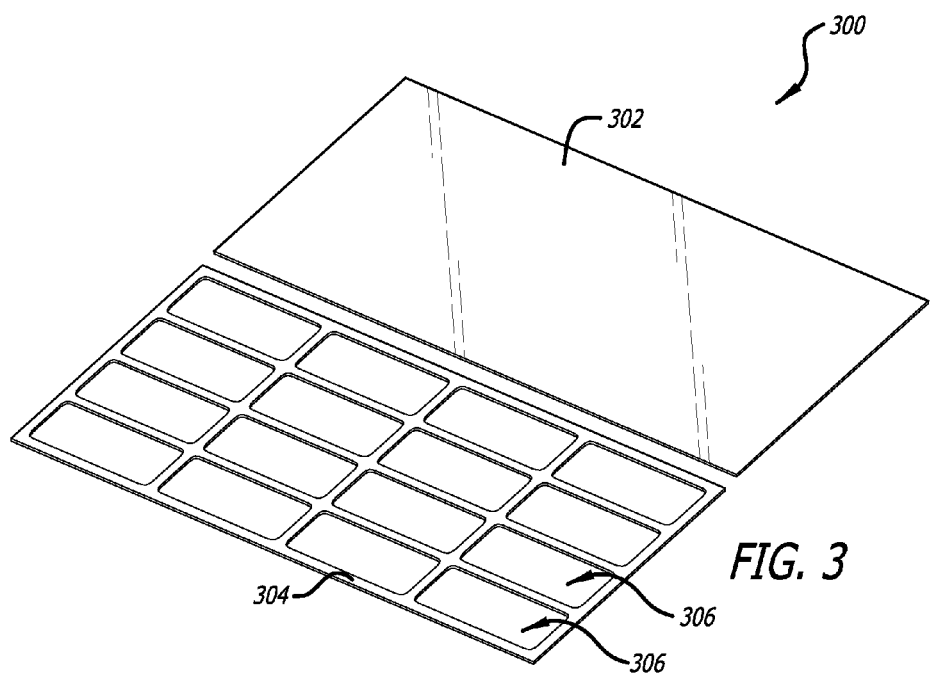
FIG. 3 illustrates a pair of glass layers that can be used to form a cover glass elements such as that illustrated in FIG. 2 in accordance with various embodiments.

For example, FIG. 3 illustrates layers 300 of material that can be used to form a cover glass element in accordance with various embodiments. Although two sheets of a certain form factor are illustrated, it should be understood that there can be additional or alternative layers, sheets, or components used in accordance with various embodiments. In this example a first sheet, herein referred to as a cover sheet 302, is formed from an appropriate process to produce a sheet that is optically flat, within an acceptable tolerance, and of a consistent thickness for a cover lens, such as at a thickness in the range of about 0.5 mm to about 1.0 mm with an acceptable amount of deviation. The cover sheet can be made of any appropriate type and material, such as soda lime glass, Gorilla glass, or float glass, from a provider such as Schott AG or Corning, formed from a material such as Sodium Alumino-Silicate or Lithium Alumino-Silicate.

A second sheet 304, herein referred to as an edge sheet, can be made of a similar material to that of the cover sheet, but in at least some embodiments need not have critical flatness or thickness control requirements as those of the cover sheet. The edge sheet can be formed of an appropriate thickness (e.g., 1.6 mm thick) determined for reasons such as a desired amount of rigidity and/or the amount of distance which the cover glass element is to wrap around the edges of a computing device. As illustrated in FIG. 3, the edge sheet 304 can have formed in it one or more openings or cavities 306 shaped to correspond to an edge or outer rim shape of the corresponding electronic device. These cavities can be formed by any appropriate process (e.g., scribing, laser cutting, ablation, or scoring, water jet cutting, etc.) known or used for machining shaped features in a sheet of glass or other such component, as well as polishing or other such processes to prevent micro-cracks or other defects that can potentially weaken the resulting cover glass element. In addition to being able to form the cavities using conventional glass machining equipment, the existence of through-holes in the sheets enables the formation of other features as well, such as undercuts or notches in the interior of the glass to help with assembly.

Once the cover and edge sheets are formed and machined to an appropriate size and shape, the sheets can be cleaned to an appropriate level of cleanliness for the thermal bonding process. In one embodiment, the sheets are taken to a clean environment to prevent particulates from adhering to the glass, wherein the sheets can undergo appropriate cleaning processes such as ultrasonic cleaning and/or passage through a sodium bath. In some embodiments, the surfaces of the sheets that are to be bonded can undergo a fine micro-etch or similar process as well, which can substantially maintain the thickness and flatness of the sheets but provide a level of surface roughness that can assist with the thermal bonding process and improve adhesion between the sheets. In other embodiments, the sheets could undergo a polishing process before bonding in order to increase their relative attraction to each other by way of optical contacting.

Figure 4:
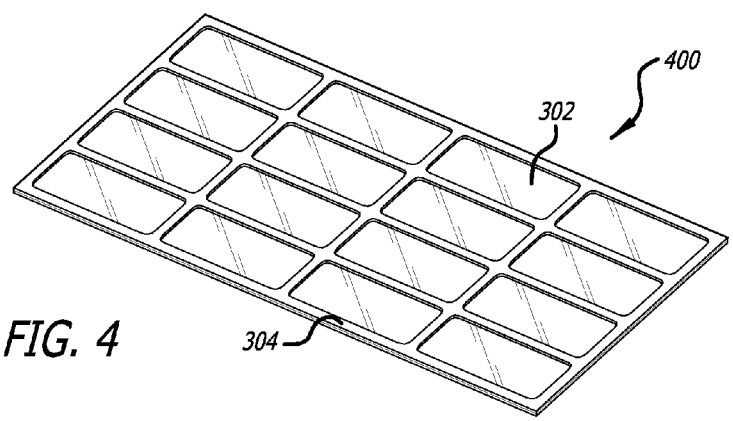
FIG. 4 illustrates the cover layer being positioned on the cavity layer for fusing in accordance with one embodiment.

Once the sheets are properly prepared, the cover sheet 302 and edge sheet 304 can be positioned in a desired orientation with respect to each other, in at least some embodiments involving a combination 400 of the edge sheet 304 on the cover sheet 302 as illustrated in FIG. 4. In some embodiments, the combined sheets 400 are placed in a vacuum chamber to attempt to remove any air pockets from between the sheets. In some embodiments, at least some additional pressure might be applied to help force out the air pockets and induce a slight force to assist with consistent bonding across the sheets. While under pressure, in the same chamber or a separate machine or furnace, an appropriate amount of heat can be applied for an amount of time to cause the sheets to thermally bond or laminated together. The sheets can be supported by a very flat platen, which might be ground to ensure optical flatness. The flatness of the platen can be critical in at least some embodiments, as the sheets will be heated to a temperature near the glass transition temperature for the material(s) of the sheets, and it can be desirable to ensure that any flow of the glass does not decrease the flatness of the cover sheet. The material of the platen can also be important due at least in part to the high temperatures, as a material with a significantly different coefficient of thermal expansion might introduce stresses in the glass that might lead to cracks or even breaking of the sheets. For example, a finely polished platen of silicon carbide can be used in some embodiments. Other example materials include a re-siliconized silicon carbide (SiC) slab with or without a nitride coating. In embodiments where a heated press is used instead of a furnace, the platens can be ceramic plates or other such components that can be used to press the sheets together and apply heat without need for a furnace element. In another embodiment, the substrate and platen can be brought to the desired bonding temperature using a doped SiC platen or a platen laminated to a graphite or invar susceptor, resulting in a conductive platen which, in turn, could be heated components such as an induction coil and an induction generator.

As mentioned, the cover sheet can be placed on the platen first in at least some embodiments to ensure that the flatness is not affected by the high temperatures. The temperatures used can depend at least in part upon the material(s) used, but for a material such as LAS80 with a glass transition temperature around 505 degrees Celsius, the temperature can be around or approaching 500 degrees Celsius. Since the softening point of that material is around 720 degrees Celsius, the sheets should substantially retain their respective shapes and avoid any decrease in flatness. Once the sheets are under an appropriate temperature for an appropriate amount of time, which can be on the order of minutes in some embodiments, the van der Waals forces will actually hold or bond the two sheets together such that the combined sheets effectively form a single glass element. Such an approach is advantageous at least for the reason that no adhesive is needed to bond the layers, which could impact the optical properties and/or appearance of the cover glass, and could adversely affect the chemical strengthening process.

It should be understood that various other bonding approaches can be used as well within the scope of the various embodiments. For example, a float approach can be used in place of a furnace platen in some embodiments. Further, some approaches can use bonding agents such as glass frit to assist with the bonding process, where those agents are not incompatible with the chemical strengthening process used in at least some embodiments. In embodiments where an etching process is used to increase the surface roughness of the sheets, the small peaks resulting from the etch can begin flowing shortly after the application of heat, such that those peaks can quickly being atomically fusing together.

Figure 5:
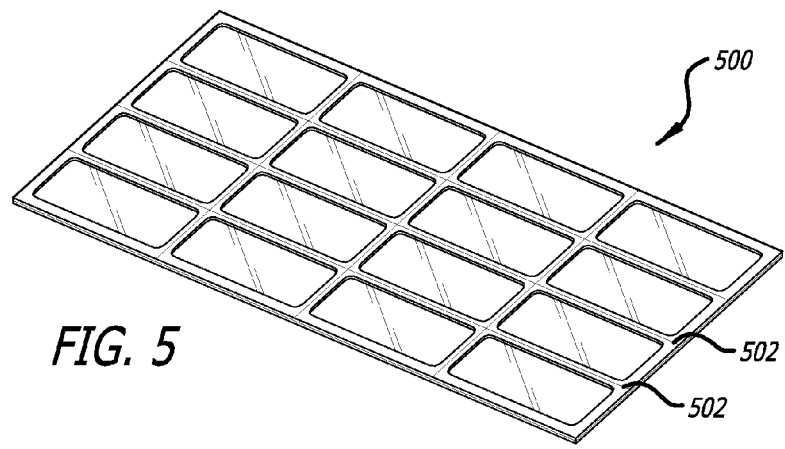
FIG. 5 illustrates example scribe lines or dicing patterns that can be used in accordance with various embodiments.

After the sheets are bonded together in the furnace or other such machine, a relatively slow temperature ramp-down process can be used to relieve stress and/or prevent damage to the glass due to fast and/or uneven temperature decreases. The amount of time can vary depending on factors such as the materials, substrate mass, dimensions or thickness of the glass, and temperatures used, but can be on the order of at least tens of minutes. After the bonded sheets are sufficiently cooled, the sheets can go through a separation process whereby the individual glass elements are cut or otherwise separated into pieces of a specific size and shape, forming multiple elements from a single sheet. The separation process of cutting out shapes, particularly shapes with round edges, in glass is not straightforward. FIG. 5 illustrates an example bonded sheet 500 showing the locations 502 where the sheet is to be separated. In some embodiments these lines can be physically scribed or printed to assist with the machining or controlled cracking process. For example, lines can be scribed a sufficient depth into the sheet such that the pieces can be manually separated at the scribe lines through an application of force. In some embodiments a cutting machine can be configured to machine or dice the sheet according to such a pattern without guide lines, but for at least certain glass sheets such a process can potentially induce unwanted stresses in the glass that can result in damage to the glass elements. In some embodiments, the separation process could use an ultra-fast laser, such as a femtosecond, picosecond, or nanosecond laser, to score the outlines of desirable shapes. Though not noticeable to the naked eye, an ultra-fast laser's focus and pulse duration can be combine to reach electric fields strong or intense enough to break and/or weaken the molecular bonds of the glass. Accordingly, a line, scored by an ultra-fast laser will then readily dissolve when subject to a weak acid in a chemical etching process. Since glass is typically impervious to a weak acid, the scored line dissolves away leaving the rest of the glass unaffected. The end result is a clean cut with a smooth edge achieved without the application of force, which can be potentially damaging to the glass. However, any appropriate process for separating portions of a glass sheet can be used as well within the scope of the various embodiments. Other lasers could be used in accordance with various embodiments. For example, the laser could be a $CO_2$ laser, a high power UV laser, and the like. In one example, a laser could be used to micro-fracture an interior of the glass between the glass' two surfaces. The micro-fracture creates an internal line of weakness for controlled cracking or cleaving. In another example, the wavelength of a UV laser could be chosen to locally heat and ablate the glass. Accordingly, systems and methods in accordance with various embodiments may utilize various high and low flux lasers to ablate, cut, score, micro-fracture, internally fracture, and break and/or weaken molecular bonds of the glass.

Figure 6:
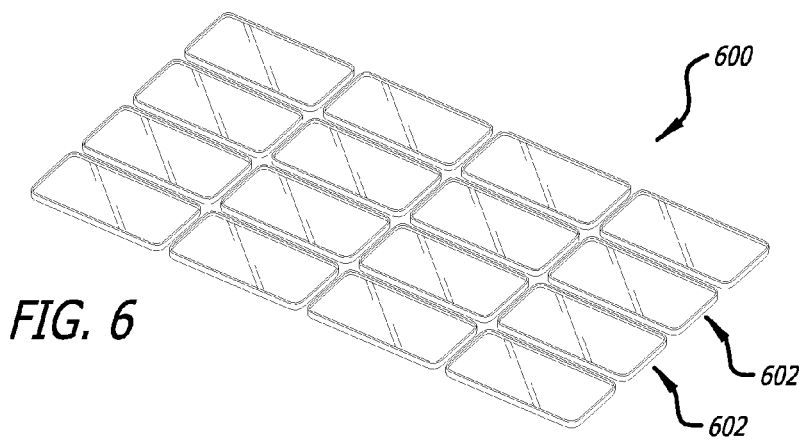
FIG. 6 illustrates example cover glass elements after dicing in accordance with one embodiment.

Once the individual cover sheet elements are separated, the elements can go through one or more machining processes to generate the final outer shape of the elements. For example, the dicing process discussed above might result in elements with a substantially rectangular outer shape with relatively sharp edges. In at least some embodiments, at least one machining process can be used to adjust the shape of the outer edge of the cover glass elements, such as to round corners to substantially match the outer edge of the electronic device intended to receive the cover glass. The inner edge from the edge layer can be used in at least some embodiments as a guide or reference for the outer edge machining process. In at least some embodiments, the same or a separate machining process can also be used to shape, radius, or spline the exposed edges or corners of the cover sheet, such that there are no sharp exposed edges or stress risers of the cover glass and the edges have a smooth, rounded feel. The radiusing of the outside edges also helps distribute pressure and load, which can help increase the strength of the cover glass element. A separate polishing process can be utilized as well where appropriate and/or desired. Once the individual cover glass elements have the desired final shape, at least for this portion of the process, the elements can undergo an appropriate chemical strengthening process in order to increase the strength and durability of the glass elements. For example, the glass elements can be submersed in a bath containing a potassium salt or potassium nitrate solution, whereby potassium ions replace sodium or other ions in the surface of the glass elements. Since the potassium ions are larger, the surface glass enters a state of compression which can cause the elements to be strengthened by several times the strength of untreated glass. After processing, a set 600 of cover glass elements 602 can result, as illustrated in FIG. 6.

The cover glass elements can also go through one or more inspection processes to ensure quality of the formed elements. For example, the elements can undergo at least one optical inspection to search for gaps in bonding or dust between the layers, as might be evidenced by van der Walls rings or Newton rings visible in the elements. Various tests such as four point bending tests can also be used to verify the bonds, as well as fine measurement processes to detect thickness variations and the like.

Figure 7:
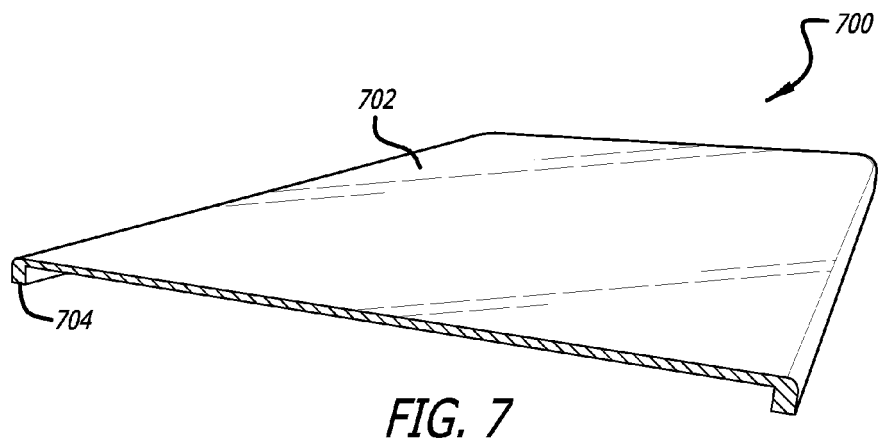
FIG. 7 illustrates a first cross-section of an example cover glass element in accordance with one embodiment.
Figure 8:
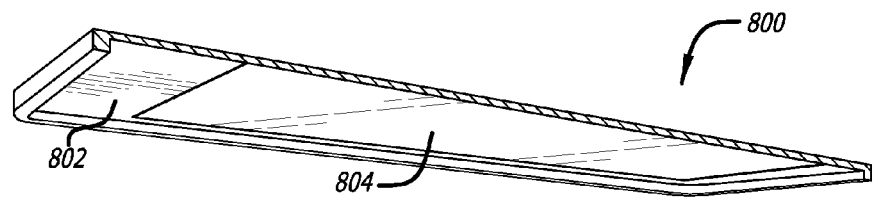
FIG. 8 illustrates a second cross-section of an example cover glass element in accordance with one embodiment.
Figure 9A:
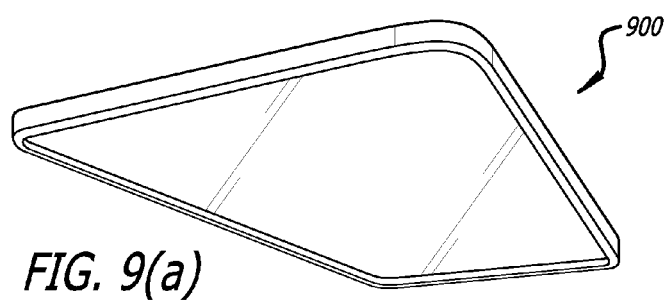
FIGS. 9(a), (b), (c), and (d) illustrate various views of example cover glass elements in accordance with various embodiments.
Figure 9B:
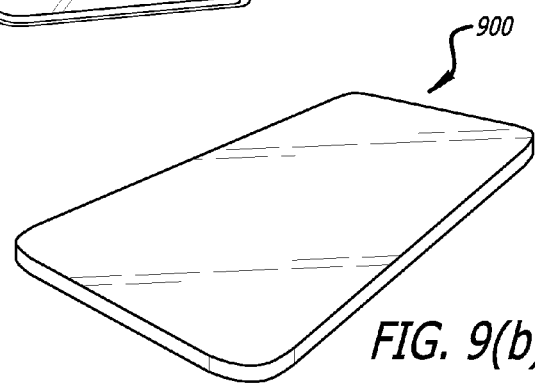
Figure 9C:
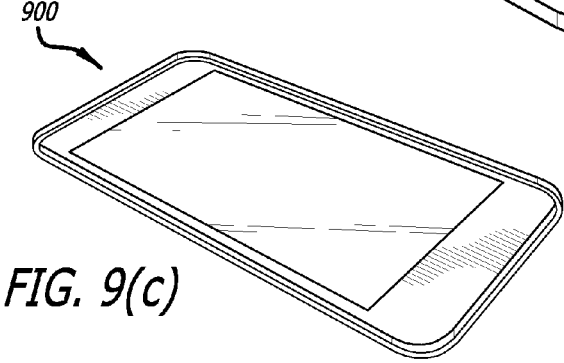
Figure 9D:
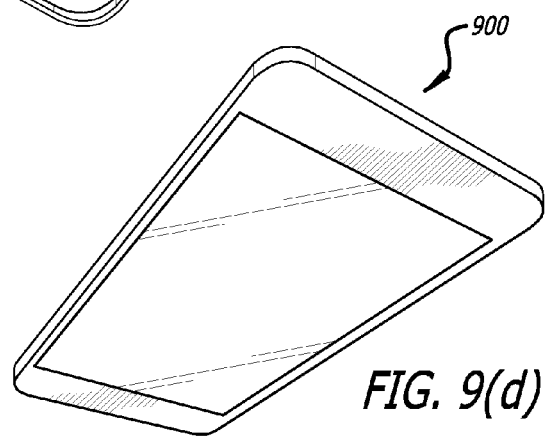

FIGS. 7 and 8 illustrate example cross-sections along orthogonal axes of a cover glass element formed in accordance with at least one embodiment. In the cross-section 700 of FIG. 7, it can be seen that the central section 702 substantially corresponding to the cover sheet has maintained its thickness and flatness, as appropriate for the functionality of the electronic device. The edge sections 704, substantially corresponding to the edge sheet, can be substantially thicker and are designed to wrap around at least a portion of the device. As discussed, the radiused edge of the sheet helps strengthen the element.

FIG. 8 illustrates another example cross section 800 along another axis. In this example, it can be seen that a mask layer 802 has been formed onto the interior surface of the glass element, leaving an open window 804 or transparent section for purposes such as content display. The mask in at least some embodiments can correspond to a black or other colored layer utilized for at least aesthetic purposes. Masks are known in the art for such purposes, but due to the three-dimensional shape of the interior of the glass element a conventional screen-printing process cannot be used successfully in at least some embodiments. In some embodiments, a photoresist mask can be deposited or otherwise formed on the window region 804 or other areas that are not to be covered with the black mask, and a process such as spraying, pad-printing, or physical vapor deposition (PVD) can be used to create the mask areas. In some embodiments, an appropriate black PVD material can be sputtered on the areas to be covered with the black mask. In at least some embodiments one or more touch sensors may be applied directly to the interior of the cover glass element, which require a flat surface that might be affected by photoresist. In such cases, laser patterning or another such process can be used to create patterns in the mask after application. For example, the interior of the element can be covered with an oxide layer (e.g., ITO) and then ablated according to the desired pattern. In at least some embodiments, the interior edge regions are not as optically critical, such that painting or another less precise process can be used to deposit the mask material on the interior edge surface.

Additional processes can be used in the various embodiments as well. For example, through holes or blind holes might be drilled or otherwise formed in the edges of the elements for purposes such as enabling screw access for assembly, passage for audio, lighting, or image content, etc. In some embodiments, additional sheets might be bonded to enable more complex three-dimensional shapes, while maintaining optical flatness where critical. In some embodiments, touch or display functionality might be utilized on a side or back of an electronic device, such that thickness and flatness might be more important on those areas in some embodiments. In some embodiments, a cover glass element can be used on the front at back of the device, as may be held together using a metal interface or other such approach. FIGS. 9(*a*), (*b*), (*c*), and (*d*) illustrate various views of an example cover glass element 900 formed using a process such as those described and suggested herein.

Figure 10:
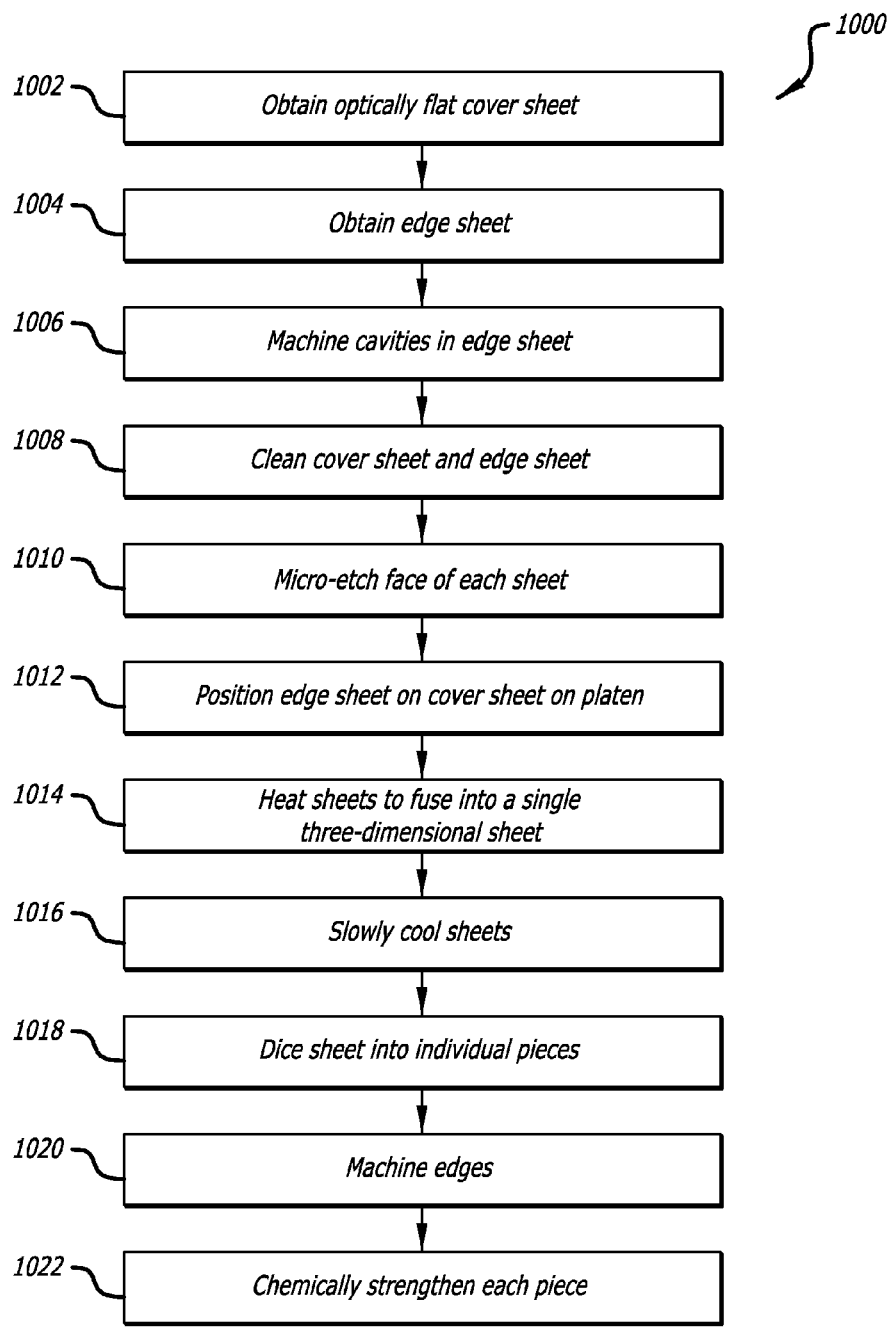
FIG. 10 illustrates an example process for forming a cover glass element in accordance with various embodiments.

FIG. 10 illustrates an example process 1000 for forming a cover glass element that can be used in accordance with various embodiments. It should be understood that, for any process discussed herein, there can be additional, fewer, or alternative steps performed in similar or alternative orders, or in parallel, within the scope of the various embodiments unless otherwise stated. In this example, an optically flat cover sheet of an appropriate material and having an appropriate and consistent thickness is obtained 1002. An edge sheet of a similar material is also obtained 1004, which can have cavities and other appropriate elements machined or formed 1006 as appropriate. Once the sheets are formed to the appropriate shapes, the cover sheet and edge sheet can be cleaned 1008 using one or more cleaning processes as discussed herein. In at least some embodiments, a micro-etch process can be used 1010 to increase a surface roughness of the sheets to be bonded and assist with the bonding process. When ready, the cover and edge sheets can be positioned 1012 and brought into contact on a platen or other such element, with vacuum or other pressure being applied as appropriate to remove air pockets and force the sheets into contact. The sheets then can be heated 1014 to an appropriate temperature, using a furnace or heated press, for example, to cause the sheets to thermally bond together to form a single, three-dimensional glass sheet. The heated sheet can go through controlled cooling to anneal the glass 1016, to prevent uneven stress buildup in the sheet due to rapid temperature change, and then separated or diced 1018 into individual cover glass elements. The edges of the individual cover glass elements can be machined, polished, and/or otherwise shaped 1020 using at least one machining tool to the final size and shape of the element, at which point the glass elements can be chemically strengthened 1022 to increase the durability of the glass elements. The glass elements can also be processed using additional processes as appropriate, such as pattern forming or masking, and at an appropriate time after any appropriate testing the elements can be utilized during the manufacture of an electronic device to become a cover element of the device.

Accordingly, systems and methods in accordance with various embodiments may utilize various automated and/or manual processes to form the cover glass element. A cover glass element in at least some embodiments can be designed utilizing a computer-aided design (CAD) program. Various machines, such as those known in the art used to cut/separate, heat, grind, polish, and/or clean the cover glass element along the various stages of production, can be automated utilizing a computer-aided manufacturing (CAM) program. These programs can produce a computer file that is interpreted to extract commands needed to operate their respective machine, which is then loaded into a computer numerical control (CNC) machine for production. Various computers and computer systems also can be used to control various aspects of components used to form a cover glass element. These computers and computer systems can execute various instructions, as may be embedded in a non-transitory computer-readable storage medium, for performing portions (or causing portions to be performed) of various processes discussed herein.

Figure 11:
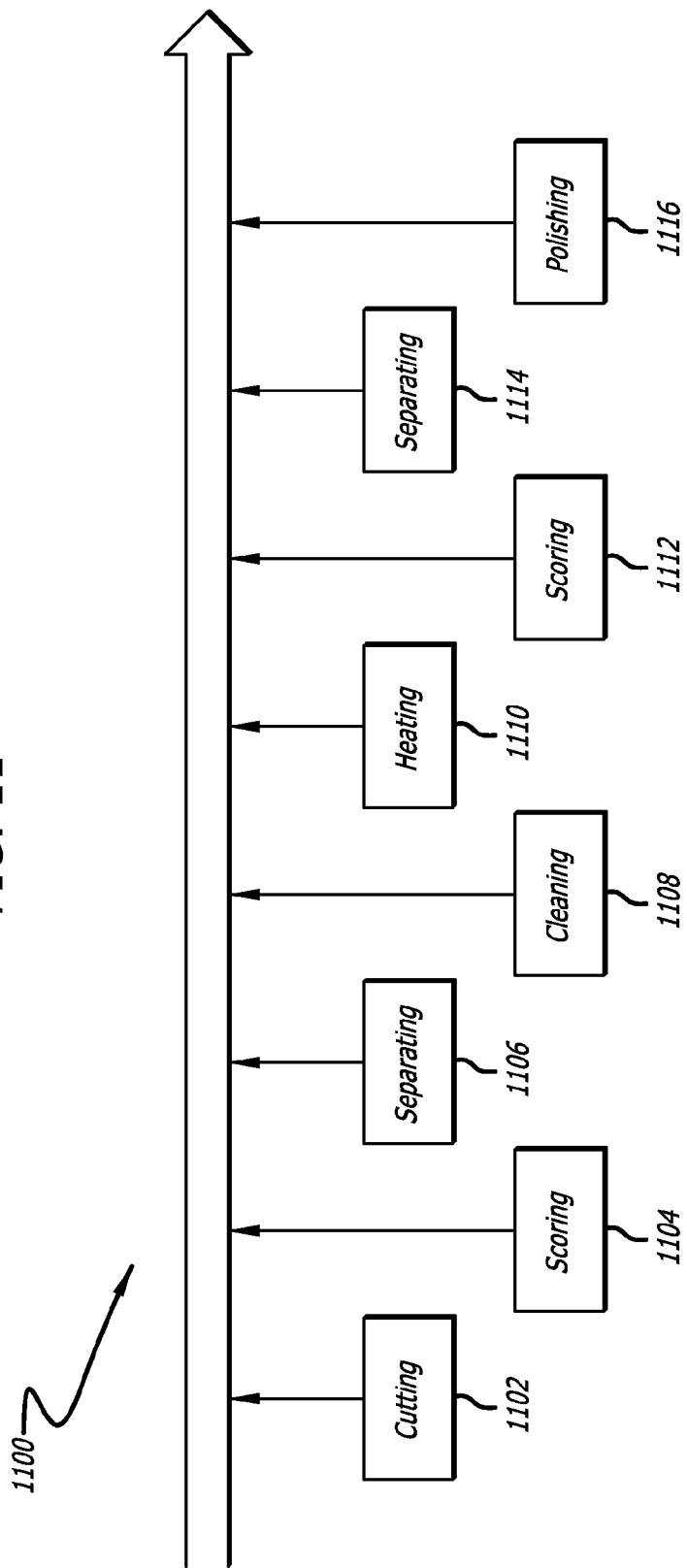
FIG. 11 illustrates a block diagram of a system for forming a cover glass element in accordance with various embodiments.

FIG. 11 illustrates an example block diagram of system 1100 for forming a cover glass element that can be used in accordance with various embodiments. It should be understood that, for any system or system element discussed herein, there can be additional, fewer, or alternative components arranged in similar or alternative orders, or in parallel, within the scope of the various embodiments unless otherwise stated. In this example, optically flat sheets of glass are obtained from a cutting element 1102. The cutting element may be part of an assembly line in a single factory for forming the cover glass elements or the cutting element may be off-site, such as provided by a third party contractor. Once the glass sheets are cut to an appropriate size and shape, a portion of the glass sheets are sent to a scoring mechanism 1104, such as a femtosecond laser, to become the edge sheet of the cover glass element. The scoring mechanism 1104 scores the edge sheet according to a scoring pattern corresponding in size and shape to a portion of an electronic device. Once the edge sheet has been scored, it proceeds to a separating mechanism 1106, such as a chemical bath for chemical etching, to form one or more holes or cavities in the edge sheet. Once the cavities are formed to the appropriate shapes, the other portion of glass sheets, the cover sheet, and edge sheet are cleaned at cleaning mechanism 1108 using one or more cleaning processes as discussed herein. In some embodiments, a micro-etch process can be used to increase a surface roughness of the sheets to assist with the bonding process that takes place at heating mechanism 1110. When ready, the cover and edge sheets are positioned and brought into contact on a platen or other such element as previously discussed for process 1000, with vacuum or other pressure being applied as discussed herein, and heated by the heating mechanism 1110 to an appropriate temperature to cause the sheets to thermally bond to form a single, glass cover sheet. The heated sheet can go through controlled cooling to anneal the glass as previously discussed. After sufficient cooling, the single glass cover sheet is sent to another scoring mechanism 1112, which is illustrated as a separate element in FIG. 11, but in other embodiments could be the same as scoring mechanism 1104. After being scored, the cover glass sheet is sent to another separating mechanism 1114 to be separated from the single cover sheet into the individual cover glass elements. Similarly, separating mechanism 1114 could be the same station as separating mechanism 1106 discussed above or it could be a separate mechanism farther down an assembly line, for example. The individual cover glass elements can be chemically strengthened and finally sent to a grinding, splining, or polishing mechanism 1116, to be further shaped and/or polished to the final size and shape.

It should be understood that the specification and drawings arc to be regarded in an illustrative rather than a restrictive sense. It will, however, be evident that various modifications and changes may be made thereunto without departing from the broader spirit and scope of the various embodiments as set forth in the claims.

What is claimed is:

1. A method of forming a cover glass element for an electronic device, comprising:
    obtaining a first glass sheet having a specified thickness and a specified flatness;
    scoring a second glass sheet with a laser according to a scoring pattern;
    etching the second glass sheet to create a plurality of through-holes, each through-hole corresponding in size and shape to a portion of an electronic device;
    bringing the first glass sheet and the second glass sheet into contact in a determined orientation, wherein a surface of the second glass sheet is in substantial contact with a surface of the first glass sheet;
    heating the first glass sheet and the second glass sheet to a temperature and with a pressure to cause the first glass sheet and the second glass sheet to thermally bond together to form a single cover sheet; and
    machining the single cover sheet to form a plurality of cover glass elements each having a first planar region of the specified thickness and the specified flatness and at least one edge region from at least a portion of the second glass sheet.

2. The method of claim 1, wherein the laser is one of a femtosecond laser, a picosecond laser, or a nanosecond laser, and wherein focus and pulse duration of the laser combine to break molecular bonds of the glass.

3. The method of claim 1, wherein machining the single cover sheet includes:
    scoring the single cover sheet with a laser; and
    chemically etching the single cover sheet to separate the plurality of cover glass elements.

4. The method of claim 3, wherein the laser is one of a femtosecond laser, a picosecond laser, or a nanosecond laser.

5. The method of claim 1, further comprising:
    attaching at least one of the plurality of cover glass elements to a touch sensitive display element.

6. A method of forming a cover glass element, comprising:
    obtaining a first glass sheet and a second glass sheet, the second glass sheet having a plurality of through-holes formed therein;
    bringing the first glass sheet and the second glass sheet into contact such that a surface of the second glass sheet having the plurality of through-holes is in substantial contact with a surface of the first glass sheet;
    heating the first glass sheet and the second glass sheet to a temperature sufficient to cause the first glass sheet and the second glass sheet to bond to form a combined cover sheet; and
    machining the combined cover sheet to form a plurality of cover glass elements each having a first planar region, from the first glass sheet, of a specified thickness and a specified flatness, and at least one edge region formed, at least in part, by the second glass sheet.

7. The method of claim 6, wherein machining the combined cover sheet includes:
    dicing the combined cover sheet to form multiple individual pieces; and
    machining at least one of the individual pieces to a desired shape for at least one cover glass element of the plurality of cover glass elements.

8. The method of claim 6, further comprising:
    polishing an outer edge of at least one cover glass element of the plurality of cover glass elements.

9. The method of claim 6, further comprising at least one of:
    shaping, radiusing, or splining an outer edge of at least one cover glass element of the plurality of cover glass elements.

10. The method of claim 6, wherein machining the combined cover sheet includes:
    creating micro-fractures in the combined cover sheet with a laser; and
    cleaving the combined cover sheet along a micro-fracture line.

11. The method of claim 6, wherein machining the combined cover sheet includes:
    ablating the combined cover sheet with a laser,
    wherein a wavelength of the laser is chosen to be optically absorbed by the combined cover sheet.

12. The method of claim 6, further comprising:
    cleaning, before heating, the first glass sheet and the second glass sheet using at least one of an ultrasonic cleaner or a chemical bath;
    cooling the combined cover sheet at a rate sufficient to prevent at least some thermal stresses; and
    chemically strengthening at least one cover glass element of the plurality of cover glass elements.

13. The method of claim 6, wherein each through-hole of the plurality of through-holes is formed to receive a display element.

14. The method of claim 6, wherein machining the combined cover sheet includes:
    scoring the combined cover sheet with a femtosecond laser; and
    chemically etching the combined cover sheet to separate the plurality of cover glass elements.

15. A method of forming a cover glass element, comprising:
    scoring a first glass sheet according to a scoring pattern;
    etching the first glass sheet to create a plurality of through-holes corresponding to the scoring pattern, each through-hole having a size capable of receiving a portion of an electronic device;
    thermally bonding the first glass sheet with a second glass sheet to form a single cover sheet, the second glass sheet having a determined thickness and a determined flatness; and
    machining the single cover sheet to form a plurality of cover glass elements each having a first planar region of the determined thickness and the determined flatness and at least one edge region from at least a portion of the first glass sheet.

16. The method of claim 15, wherein each of the plurality of through-holes is formed to receive a display element of the electronic device, and a portion of the each of the plurality of one cover glass elements corresponding to the first glass sheet forms an edge region that substantially wraps around edges of the electronic device.

17. The method of claim 15, wherein the first glass sheet is scored with at least one of a femtosecond laser, a picosecond laser, or a nanosecond laser.

18. The method of claim 15, further comprising:
cleaning the first glass sheet and the second glass sheet using at least one of an ultrasonic cleaner or a chemical bath before thermally bonding the first glass sheet with the second glass sheet;
cooling the single cover sheet; and
chemically strengthening the single cover sheet.

19. The method of claim 15, wherein machining the single cover sheet includes:
scoring the single cover sheet with a laser; and
chemically etching the single cover sheet to separate the plurality of cover glass elements.

20. The method of claim 15, wherein machining the single cover sheet includes:
ablating the single cover sheet with a laser,
wherein a wavelength of the laser is chosen to be optically absorbed by the at least one cover glass element.

* * * * *